(12) United States Patent  
Curina et al.

(10) Patent No.: US 12,451,881 B2  
(45) Date of Patent: Oct. 21, 2025

(54) RECEIVER CIRCUIT, CORRESPONDING ISOLATED DRIVER DEVICE, ELECTRONIC SYSTEM AND METHOD OF DECODING A DIFFERENTIAL SIGNAL INTO A DIGITAL OUTPUT SIGNAL

(71) Applicant: STMicroelectronics International N.V., Geneva (CH)

(72) Inventors: Carlo Curina, Bareggio (IT); Valerio Bendotti, Vilminore di Scalve (IT); Nicola De Campo, Cura Carpignano (IT); Valerio Gennari Santori, Milan (IT)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 18/526,776

(22) Filed: Dec. 1, 2023

(65) Prior Publication Data  
US 2024/0195405 A1   Jun. 13, 2024

(30) Foreign Application Priority Data  
Dec. 7, 2022   (IT) .......... 102022000025200

(51) Int. Cl.  
*H03K 17/22* (2006.01)  
*H03K 5/24* (2006.01)  
*H03K 19/0185* (2006.01)

(52) U.S. Cl.  
CPC ......... *H03K 17/223* (2013.01); *H03K 5/2454* (2013.01); *H03K 5/2481* (2013.01); *H03K 19/018514* (2013.01)

(58) Field of Classification Search  
CPC .. H03K 17/223; H03K 5/2454; H03K 5/2481; H03K 19/018514;  
(Continued)

(56) References Cited

U.S. PATENT DOCUMENTS 4,835,486 A   5/1989   Somerville  
7,667,500 B1   2/2010   Alfke  
(Continued)

FOREIGN PATENT DOCUMENTS

EP   1309144 A1   5/2003

OTHER PUBLICATIONS

U.S. Appl. No. 18/531,568, filed Dec. 6, 2023.

*Primary Examiner* — Jung Kim  
(74) *Attorney, Agent, or Firm* — Seed Intellectual Property Law Group LLP

(57) ABSTRACT

A receiver circuit receives a differential signal that includes positive and negative spikes, and produces an output signal as a function of the differential signal. A first comparator produces an intermediate set signal that includes a pulse at each positive spike of the differential signal, and a second comparator produces an intermediate reset signal that includes a pulse at each negative spike of the differential signal. A logic circuit detects whether the digital signal switches between a first value and a second value, and whether the intermediate reset signal and the intermediate set signal include pulses lasting longer than a threshold. The logic produces a set correction signal and a reset correction signal. The logic circuit produces a corrected set signal and a corrected reset signal. An output circuit produces an output signal based on the corrected set signal and the corrected reset signal.

20 Claims, 6 Drawing Sheets

(58) Field of Classification Search
CPC ......... H03K 2217/0063; H03K 17/063; H03K 17/689; H03K 17/14; H03K 17/145; H03K 19/00369; H03K 19/00376; H03K 19/00384; H03K 2017/0806
See application file for complete search history.

(56) References Cited

U.S. PATENT DOCUMENTS

| | | |
|---|---|---|
| 2010/0134185 A1 | 6/2010 | Liu |
| 2010/0315150 A1 | 12/2010 | Ochi |
| 2013/0301690 A1 | 11/2013 | Shrestha |
| 2015/0180228 A1 | 6/2015 | Mills et al. |
| 2018/0013353 A1 | 1/2018 | Nate |
| 2020/0266718 A1 | 8/2020 | Liu et al. |
| 2022/0360894 A1* | 11/2022 | Carfore ................ H10N 30/302 |
| 2022/0417076 A1 | 12/2022 | Bendotti et al. |
| 2023/0170863 A1 | 6/2023 | Labbe et al. |
| 2023/0231504 A1 | 7/2023 | Eswaran et al. |
| 2024/0205055 A1 | 6/2024 | Gennari Santori et al. |

* cited by examiner

RECEIVER CIRCUIT, CORRESPONDING ISOLATED DRIVER DEVICE, ELECTRONIC SYSTEM AND METHOD OF DECODING A DIFFERENTIAL SIGNAL INTO A DIGITAL OUTPUT SIGNAL

CROSS REFERENCE TO RELATED APPLICATION(S)

This application claims the priority benefit of Italian patent application number 102022000025200, filed on Dec. 7, 2022, entitled "RECEIVER CIRCUIT, CORRESPONDING ISOLATED DRIVER DEVICE, ELECTRONIC SYSTEM AND METHOD OF DECODING A DIFFERENTIAL SIGNAL INTO A DIGITAL OUTPUT SIGNAL" which is hereby incorporated by reference to the maximum extent allowable by law.

BACKGROUND

Technical Field

The description relates to isolated gate driver devices, which may be applied, for instance, in traction inverters, DC/DC converters, on-board chargers (OBC), and belt starter generators (BSG) for electric vehicles (EV) and hybrid electric vehicles (HEV).

Description of the Related Art

Conventional isolated gate driver devices are system-on-chip devices used to switch transistors (such as IGBT, SiC or Si MOSFET) in high-voltage motor control applications. Conventional isolated gate driver devices usually include two semiconductor dies arranged in the same package: a low-voltage die that exchanges signals with a microcontroller, and a high-voltage die that includes the driver circuit. The low-voltage die and the high-voltage die are electrically isolated one from the other by a galvanic isolation barrier, which usually includes one or more high-voltage capacitors (HVCap) arranged between the two dies.

FIG. 1 is a circuit block diagram exemplary of an isolated gate driver device. FIG. 2 is a time diagram including waveforms exemplary of signals in the device of FIG. 1, which illustrates possible operation of the device.

As exemplified in FIG. 1, an isolated gate driver device 10 includes a low-voltage semiconductor die 10a and a high-voltage semiconductor die 10b arranged in the same package. A communication channel is provided in the device 10, so that a (single-ended) pulse-width modulated (PWM) input signal $PWM_{IN}$ (also referred to as low-voltage transmission signal, e.g., a PWM signal having a frequency between 15 kHz and 5 MHz received from a microcontroller) received at an input pin 101 of the low-voltage die 10a can be propagated as a (single-ended) PWM output signal $PWM_{OUT}$ (also referred to as high-voltage reception signal) produced at an output pin 106 of the high-voltage die 10b. In certain applications, the communication channel may be bi-directional, so that a (single-ended) PWM input signal (also referred to as high-voltage transmission signal) received at an input pin of the high-voltage die 10b—not visible in FIG. 1—can be propagated as a (single-ended) PWM output signal (also referred to as low-voltage reception signal) transmitted by an output pin of the low-voltage die 10a—also not visible in FIG. 1.

In particular, the low-voltage die 10a includes a transmitter circuit 102 coupled to the input pin 101 and configured to convert the received single-ended signal $PWM_{IN}$ into a pair of differential PWM signals $OUT_P$, $OUT_N$. For instance, signal $OUT_P$ may be generated at the output of a buffer circuit that receives signal $PWM_{IN}$ at input, and signal $OUT_N$ may be generated at the output of another buffer circuit that receives the complement (e.g., an inverted replica) of signal $PWM_{IN}$ at input (e.g., an inverting buffer). The low-voltage die 10a further includes a first high-voltage capacitor 103P (e.g., an isolation capacitor) having a first terminal coupled to the first output of the transmitter circuit 102 to receive signal $OUT_P$, and a second high-voltage capacitor 103N (e.g., an isolation capacitor) having a first terminal coupled to the second output of the transmitter circuit 102 to receive signal $OUT_N$. The second terminals of the capacitors 103P and 103N provide the output nodes of the low-voltage die 10a, which are electrically connected (e.g., via bonding wires) to the input nodes of the high-voltage die 10b. The signals $OUT_P$, $OUT_N$ are thus filtered by the isolation capacitors 103P, 103N (acting as a high-pass filter) so that a pulsed differential signal Vd reaches the high-voltage die 10b. Additionally, the transmitter circuit 102 may implement a "gate retry" mechanism: the PWM input signal $PWM_{IN}$ is clocked by a clock signal CLK available in the low-voltage die 10a and having a frequency higher than the frequency of signal $PWM_{IN}$ (e.g., five times higher, ten times higher, or more), so that a spike is generated in the differential signal Vd at each edge of the clock signal CLK in order to facilitate recovering from possible pulse missing and allow correct reconstruction of signal $PWM_{IN}$ at the receiver side. The differential signal Vd thus includes a train of temporized spikes (positive and negative) corresponding to the edges of the input signal $PWM_{IN}$ and the edges of the clock signal CLK, with the sign of these spikes being dependent on the value of the input signal $PWM_{IN}$, as exemplified in FIG. 2. In particular, when the input signal $PWM_{IN}$ has a high logic value (logic '1') the spikes of signal Vd are positive, and when the input signal $PWM_{IN}$ has a low logic value (logic '0') the spikes of signal Vd are negative.

The high-voltage die 10b includes a receiver circuit 104 coupled to the input nodes of die 10b to receive the differential signal Vd, and configured to produce a reconstructed PWM signal $PWM_{RX}$ as a function of the received differential signal Vd. For instance, the receiver circuit 104 may be configured to set signal $PWM_{RX}$ to a high logic value (logic '1') as a result of a positive pulse being detected in the differential signal Vd, and to a low logic value (logic '0') as a result of a negative pulse being detected in the differential signal Vd, as exemplified in FIG. 2. Therefore, the reconstructed signal $PWM_{RX}$ may substantially correspond to a (slightly) delayed copy of the input signal $PWM_{IN}$. The high-voltage die 10b may further include a driver stage 105 including a pre-driver circuit (e.g., buffers 1051, 1052, 1053) configured to receive the reconstructed signal $PWM_{RX}$ and drive an output switching circuit as a function thereof (e.g., inverting at inverter 1051 and/or amplifying at buffers 1052, 1053 the reconstructed signal $PWM_{RX}$). For instance, the output switching circuit may include a half-bridge driving stage that includes a high-side switch (e.g., transistor) and a low-side switch (e.g., transistor) arranged in series between a high-voltage supply pin VH and a high-voltage reference (or ground) pin VL of the gate driver device 10. A node intermediate the high-side switch and the low-side switch may be electrically coupled to the output pin 106 of the gate driver device 10. The high-side switch and the low-side switch are driven by the pre-driver circuit 1051, 1052, 1053 so that the output switching signal $PWM_{OUT}$ is produced at the output pin 106 (e.g., the high-side switch is in a conductive state when $PWM_{RX}=$'1' and the low-side switch is in a conductive state when $PWM_{RX}=$'0').

In the present disclosure, reference is made to the case where the isolation capacitors 103P, 103N are implemented in the low-voltage die 10a. However, it will be understood that the isolation capacitors could alternatively be implemented in the high-voltage die 10b, e.g., arranged between the input pins of the high-voltage die 10b and the input terminals of the receiver circuit 104.

FIG. 3 is a circuit block diagram exemplary of a possible implementation of receiver circuit 104, and FIG. 4 is a time diagram including waveforms exemplary of signals in the receiver circuit 104 of FIG. 3, which illustrates possible operation of the receiver circuit. The input terminals of circuit 104, which may be referenced to a local (high-voltage) ground $GND_{HV}$ via respective resistors, receive the differential signal Vd and are coupled to an amplifier stage 40 that produces an amplified replica of the differential signal Vd. The amplified differential signal is received at a pair of comparators 42, 44 having opposite input polarities (e.g., the positive output of amplifier 40 may be coupled to the negative input of comparator 42 and to the positive input of comparator 44, and the negative output of amplifier 40 may be coupled to the positive input of comparator 42 and to the negative input of comparator 44). Therefore, comparator 42 produces a (digital) signal $COMP_N$ that includes pulses corresponding to the positive spikes of signal Vd (e.g., signal $COMP_N$ is normally high and includes low pulses, as exemplified in FIG. 4) and comparator 44 produces a (digital) signal $COMP_P$ that includes pulses corresponding to the negative spikes of signal Vd (e.g., signal $COMP_P$ is normally high and includes low pulses, as exemplified in FIG. 4). Signals $COMP_N$ and $COMP_P$ are used as the set and reset signals of a set-reset (S-R) flip-flop 46 of receiver 104. In particular, flip-flop 46 receives a bias voltage $V_{DD}$ (e.g., 3.3 V) at its data input terminal D, signal $COMP_N$ (possibly complemented by an inverter stage) at its clock input terminal $C_P$, and signal $COMP_P$ at its reset input terminal $C_D$. The data output terminal Q of flip-flop 46 is therefore set to a high logic value (logic '1') in response to a pulse of signal $COMP_N$ (in particular, in response to a falling edge of signal $COMP_N$) and to a low logic level (logic '0') in response to a pulse of signal $COMP_P$ (in particular, in response to a falling edge of signal $COMP_P$), thereby producing the reconstructed PWM signal $PWM_{RX}$ that corresponds to a (delayed) copy of the input PWM signal $PWM_{IN}$ sent by the low-voltage die 10a of device 10 (as exemplified in FIG. 4). The time interval between two consecutive spikes of signal Vd (and thus between two consecutive pulses of signal $COMP_N$ or $COMP_P$) is equal to half of the clock period Tux of the low-voltage clock signal CLK (e.g., $T_{CLK}/2$).

As anticipated, a driver device 10 may be used for motor control applications, as exemplified in the circuit block diagram of FIG. 5, which shows the driver portion of device 10 having its output pin 106 (e.g., the central node or switching node of the half-bridge driver that includes a high-side switch HS and a low-side switch LS) coupled to an external load such as a motor M. As exemplified in FIG. 5, the low-side driver circuit 1053 may be supplied between the supply voltage of die 10b available at pin VH and the local ground voltage $GND_{HV}$ (the latter being available at pin VL), while the high-side driver circuit 1052 may be supplied between the supply voltage of die 10b available at pin VH and the switching node 106 (i.e., it may be referenced to a floating ground GNDs). In such a scenario, during the switching activity of the half-bridge circuit, the switching node 106 that provides the high-side floating ground GNDs switches continuously between the local ground voltage $GND_{HV}$ (e.g., 0 V) and the supply voltage of die 10b available at pin VH, which can be in the order of thousand volts. Therefore, the driver device 1052 may be subjected to fast slew-rate voltage transitions between GND and GNDs of dies 10a and 10b. These events may generate an abrupt current flow that produces a common-mode voltage at the input terminals of the receiver circuit 104. The input terminals of receiver 104 may be affected by mismatch (e.g., due to parasitic capacitors towards the low-voltage ground associated to the bonding wires), so the common-mode voltage may be converted in a spurious differential voltage that adds to signal Vd.

The scenario above is exemplified in the circuit block diagram of FIG. 6, which substantially replicates the circuit block diagram of FIG. 3 but additionally indicates a common-mode voltage $V_{CM}$ applied to the input terminals of amplifier 40. FIG. 7 is a time diagram including waveforms exemplary of signals in the receiver circuit of FIG. 6, when such a common-mode voltage $V_{CM}$ affects the differential signal Vd. It will be understood that the voltage generator depicted in FIG. 6 is not a component actually implemented in the circuit, but just indicates the effect of applying a common-mode voltage to the input terminals of receiver 104. In particular, the waveform of the common-mode voltage $V_{CM}$ produced between the low-voltage ground $GND_{LV}$ and the high-voltage ground $GND_{HV}$ during transient events may include a high slew-rate ramp followed by a ringing phase (e.g., a damped sinusoidal) due to the effect of (external) parasitic components. As results, due to the mismatch of the input terminals of amplifier 40, the receiver 104 senses a differential damped sinusoidal high-frequency signal, whose frequency may fall within the amplification band of the receiver chain (e.g., the band of amplifier 40). This damped sinusoidal signal may thus be amplified and produce a sequence of spurious set and reset pulses (e.g., spurious pulses SP of signals $COMP_N$ and $COMP_P$, as exemplified in FIG. 7) that are subsequently sensed by flip-flop 46 and produce unwanted commutations of the reconstructed signal $PWM_{RX}$ (e.g., commutations UC of signal $PWM_{RX}$, as exemplified in FIG. 7).

In order to mitigate the above-discussed issue of spurious pulses in the reconstructed signal $PWM_{RX}$ due to common-mode ringing effects in the differentia signal Vd, a possible approach is that of implementing the isolation capacitors 103P, 103N in the high-voltage die 10b. This implementation cancels the effect of the mismatch of the bonding wires between die 10a and die 10b, which would be dominated by the transmitter low equivalent impedance. However, such an approach may call for the isolation capacitors 103P, 103N to be realized in the same technology of the high-voltage die 10b, which may be cumbersome, costly and/or area-consuming.

Therefore, there is a need in the art to provide a receiver circuit (e.g., for implementation in an isolated communication channel of a gate driver device) having an improved architecture that solves the issue discussed above or, in other terms, a receiver circuit having an improved common-mode transient immunity (CMTI).

BRIEF SUMMARY

Embodiments of the present disclosure contribute in providing an improved receiver circuit.

One or more embodiments may relate to a corresponding isolated driver device.

One or more embodiments may relate to a corresponding electronic system.

One or more embodiments may relate to a corresponding method of decoding a differential pulsed signal transmitted across a galvanic isolation barrier to produce a pulse-width modulated digital signal.

The claims are an integral part of the technical teaching provided herein in respect of the embodiments.

According to an aspect of the present description, in a receiver circuit a pair of input nodes are configured to receive a differential signal therebetween. The differential signal includes spikes of a first polarity (e.g., positive) and spikes of a second polarity (e.g., negative). An output node is configured to produce a digital output signal as a function of the differential signal. A first comparator circuit is configured to receive the differential signal and to produce an intermediate set signal that includes a pulse at each spike of the differential signal having the first polarity. A second comparator circuit is configured to receive the differential signal and to produce an intermediate reset signal that includes a pulse at each spike of the differential signal having the second polarity. A logic circuit is configured to receive the intermediate set signal, the intermediate reset signal and the digital output signal. The logic circuit is further configured to:

- detect whether the digital output signal switches between a first logic value and a second logic value;
- detect whether the intermediate reset signal includes a pulse having a duration higher than a certain time interval (e.g., a threshold);
- produce a set correction signal that includes a pulse when the digital output signal switches between a first logic value and a second logic value and, at the same time, the intermediate reset signal includes a pulse having a duration higher than the certain time interval;
- produce a corrected set signal that includes the pulses of the intermediate set signal and the pulses of the set correction signal;
- detect whether the intermediate set signal includes a pulse having a duration higher than the certain time interval;
- produce a reset correction signal that includes a pulse when the digital output signal switches between a first logic value and a second logic value and, at the same time, the intermediate set signal includes a pulse having a duration higher than the certain time interval; and
- produce a corrected reset signal that includes the pulses of the intermediate reset signal and the pulses of the reset correction signal.

The receiver circuit includes an output control circuit configured to receive the corrected set signal and the corrected reset signal, and further configured to assert the digital output signal in response to a pulse being detected in the corrected set signal and de-assert the digital output signal in response to a pulse being detected in the corrected reset signal.

One or more embodiments may thus provide a receiver circuit having an improved robustness against common-mode noises that uses simple logic circuitry.

Optionally, the logic circuit includes:

- a first asymmetric buffer circuit configured to receive the intermediate reset signal and produce a first detection signal by passing the active (e.g., falling) edges of the intermediate reset signal with a delay equal to the certain time interval and passing the inactive (e.g., rising) edges of the intermediate reset signal without substantial delay;
- a first gating logic gate configured to pass the first detection signal when the digital output signal switches between a first logic value and a second logic value, and mask the first detection signal otherwise, to produce the set correction signal;
- a second asymmetric buffer circuit configured to receive the intermediate set signal and produce a second detection signal by passing the active (e.g., falling) edges of the intermediate set signal with a delay equal to the certain time interval and passing the inactive (e.g., rising) edges of the intermediate set signal without substantial delay; and
- a second gating logic gate configured to pass the second detection signal when the digital output signal switches between a first logic value and a second logic value, and mask the second detection signal otherwise, to produce the reset correction signal.

According to another aspect of the present description, an isolated driver device includes a first semiconductor die and a second semiconductor die. The first semiconductor die includes an input pin configured to receive a digital input signal. The first semiconductor die includes a transmitter circuit configured to receive the digital input signal and to produce a pair of complementary digital signals. A first one of the complementary digital signals is a replica of the digital input signal and is produced at a first output node of the transmitter circuit, and a second one of the complementary digital signals is the complement of the digital input signal and is produced at a second output node of the transmitter circuit. The first semiconductor die includes a galvanic isolation barrier including a first isolation capacitor having a first terminal coupled to the first output node of the transmitter circuit and a second isolation capacitor having a first terminal coupled to the second output node of the transmitter circuit. A differential signal is produced between a second terminal of the first isolation capacitor and a second terminal of the second isolation capacitor. The differential signal includes a spike of a first polarity at each rising edge of the digital input signal and a spike of a second polarity at each falling edge of the digital input signal. The second semiconductor die includes a receiver circuit according to one or more embodiments. A first input node of the receiver circuit is electrically coupled to the second terminal of the first isolation capacitor and a second input node of the receiver circuit is electrically coupled to the second terminal of the second isolation capacitor to receive the differential signal.

According to another aspect of the present description, an electronic system includes a processing unit and an isolated driver device according to one or more embodiments. The processing unit is configured to generate the digital input signal received by the isolated driver device.

According to another aspect of the present description, a method of decoding a differential signal into a digital output signal includes:

- receiving a differential signal that includes spikes of a first polarity (e.g., positive) and spikes of a second polarity (e.g., negative);
- producing an intermediate set signal that includes a pulse at each spike of the differential signal having the first polarity;
- producing an intermediate reset signal that includes a pulse at each spike of the differential signal having the second polarity;

detecting whether the digital output signal switches between a first logic value and a second logic value;

detecting whether the intermediate reset signal includes a pulse having a duration higher than a certain time interval (e.g., a threshold);

producing a set correction signal that includes a pulse when the digital output signal switches between a first logic value and a second logic value and, at the same time, the intermediate reset signal includes a pulse having a duration higher than the certain time interval;

producing a corrected set signal that includes the pulses of the intermediate set signal and the pulses of the set correction signal;

detecting whether the intermediate set signal includes a pulse having a duration higher than the certain time interval;

producing a reset correction signal that includes a pulse when the digital output signal switches between a first logic value and a second logic value and, at the same time, the intermediate set signal includes a pulse having a duration higher than the certain time interval;

producing a corrected reset signal that includes the pulses of the intermediate reset signal and the pulses of the reset correction signal; and asserting the digital output signal in response to a pulse being detected in the corrected set signal and de-asserting the digital output signal in response to a pulse being detected in the corrected reset signal.

BRIEF DESCRIPTION OF THE SEVERAL VIEWS OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is included in at least one embodiment. Hence, phrases such as "in an embodiment" or "in one embodiment" that may be present in one or more points of the present description do not necessarily refer to one and the same embodiment. Moreover, particular configurations, structures, or characteristics may be combined in any adequate way in one or more embodiments.

The headings/references used herein are provided merely for convenience and hence do not define the extent of protection or the scope of the embodiments.

Throughout the figures annexed herein, unless the context indicates otherwise, like parts or elements are indicated with like references/numerals and a corresponding description will not be repeated for the sake of brevity.

Figure 7:
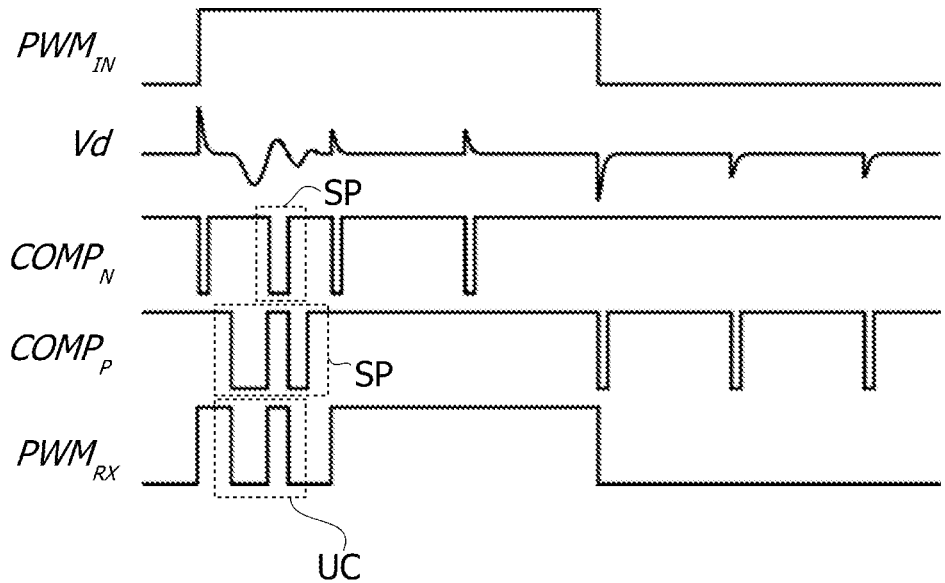
Figure 8:
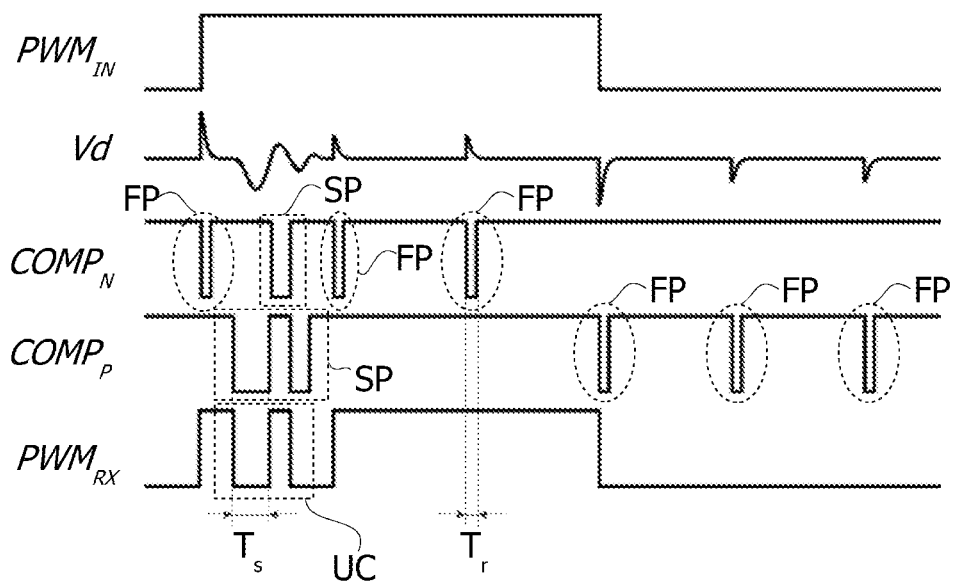
FIG. 8 is a time diagram including waveforms exemplary of signals in a conventional receiver circuit, e.g., for use in an isolated communication channel of a driver device.

One or more embodiments relate to a receiver circuit that is configured to reject the spurious pulses SP produced in the set and reset signals $COMP_N$ and $COMP_P$ due to unwanted oscillations of the differential signal Vd (e.g., ringing effects caused by common-mode voltage transients applied at the input of the receiver circuit) to improve the common-mode transient immunity (CMTI). By way of introduction to the detailed description of exemplary embodiments, reference may first be made to FIG. 8, which is a time diagram including waveforms exemplary of signals in a conventional receiver circuit 104 (substantially reproducing the contents of FIG. 7). Here, it is shown that the pulses FP of the set and reset signals $COMP_N$, $COMP_P$ that are functional for the correct operation (e.g., correct signal decoding) of the set-reset flip-flop 46 (e.g., the pulses generated at the edges of the clock signal CLK and at the edges of the input signal $PWM_{IN}$) generally have a duration $T_r$ that is in a certain range (e.g., between 1 ns and 2 ns), while the spurious pulses SP of the set and reset signals $COMP_N$, $COMP_P$ due to common-mode transients and ringing effects have a longer duration $T_s$, i.e., a duration that exceeds the maximum duration of pulses FP (e.g., higher than 2 ns, for instance around 10 ns). Therefore, one or more embodiments rely on an improved receiver architecture, which includes a logic circuit configured to correct the value of the output signal $PWM_{RX}$ produced by the flip-flop 46 by generating corrected set and reset signals if the following conditions are satisfied:

i) the duration of the pulses produced at the output of comparators 42 and 44 (i.e., the pulses of signals $COMP_N$ and $COMP_P$) is higher than a certain threshold, with the value of the threshold being higher than the maximum duration $T_r$ allowed for a functional pulse FP (indicating that the pulse is indeed a spurious one); and ii) a commutation of the output signal $PWM_{RX}$ is detected (indicating that the spurious pulse has indeed to be corrected, insofar as it would otherwise force the output signal $PWM_{RX}$ to a wrong value).

Figure 9:
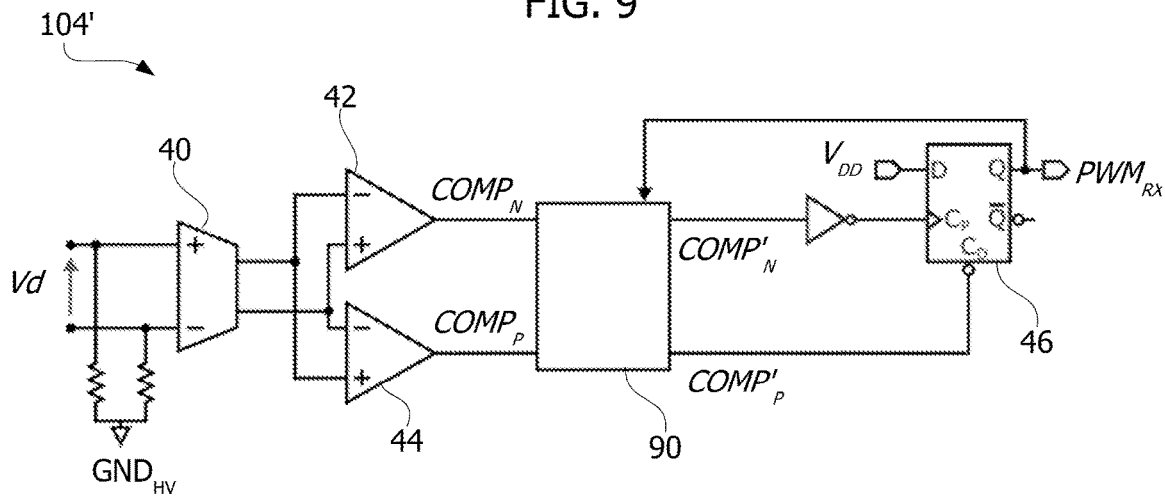
FIG. 9 is a circuit block diagram exemplary of a receiver circuit according to one or more embodiments of the present description, e.g., for use in an isolated communication channel of a driver device.

One or more embodiments may thus relate to a receiver circuit 104' as exemplified in the circuit block diagram of FIG. 9, where parts or elements similar to those described with reference to the previous Figures are indicated by the same or similar reference numbers, and a corresponding description is not repeated for brevity. In particular, the receiver circuit 104' includes a logic circuit 90 arranged between the output terminals of the comparators 42, 44 and the input terminals of the set-reset flip-flop 46. The logic circuit 90 receives the "original" set and reset signals $COMP_N$, $COMP_P$, which are possibly affected by spurious pulses, as well as the reconstructed PWM signal $PWM_{RX}$ produced by the flip-flop 46. The logic circuit 90 is configured to produce the "corrected" set and reset signals $COMP'_N$, $COMP'_P$, which are propagated to the flip-flop 46 (with signal $COMP'_N$ possibly complemented, just like previously described with reference to FIG. 3) and result in a reconstructed PWM signal $PWM_{RX}$ that may not be free from spurious pulses but is suitable to correctly drive the output switching stage 105, HS, LS so that the output PWM signal $PWM_{OUT}$ is free from spurious pulses, as further discussed in the following. In particular, one or more embodiments rely on the fact that signal $PWM_{RX}$ may include spurious pulses, but the duration of such spurious pulses is reduced to a value lower than the propagation delay $T_{delay}$ of the output switching stage, so that those pulses may not affect the value of the output PWM signal $PWM_{OUT}$.

In particular, the logic circuit 90 is configured to:
  detect the presence of spurious pulses in the signals $COMP_N$, $COMP_P$ based on the duration of the pulses (e.g., selecting only those pulses longer than a threshold $T_{count}$, where $T_{count}$ is selected to be longer than the maximum duration $T_r$ of a functional pulse);
  discard the spurious pulses that would not negatively affect the value of the reconstructed PWM signal $PWM_{RX}$ (e.g., in the examples considered herein, discard the spurious pulses of signal $COMP_N$ that take place while signal $PWM_{IN}$ has a high logic value, and the spurious pulses of signal $COMP_P$ that take place while signal $PWM_{IN}$ has a low logic value); and
  in response to a spurious pulse being detected in one of signals $COMP_N$, $COMP_P$ and not being discarded, producing a corrective pulse in the other one of signals $COMP_N$, $COMP_P$ thereby producing the corrected set and reset signals $COMP'_N$, $COMP'_P$ so as to force the reconstructed PWM signal $PWM_{RX}$ back to its correct value within a time period $T_{count}$ shorter than the propagation delay $T_{delay}$ of the output switching stage, so that the value of the output PWM signal $PWM_{OUT}$ does not switch to an incorrect value.

Figure 10:
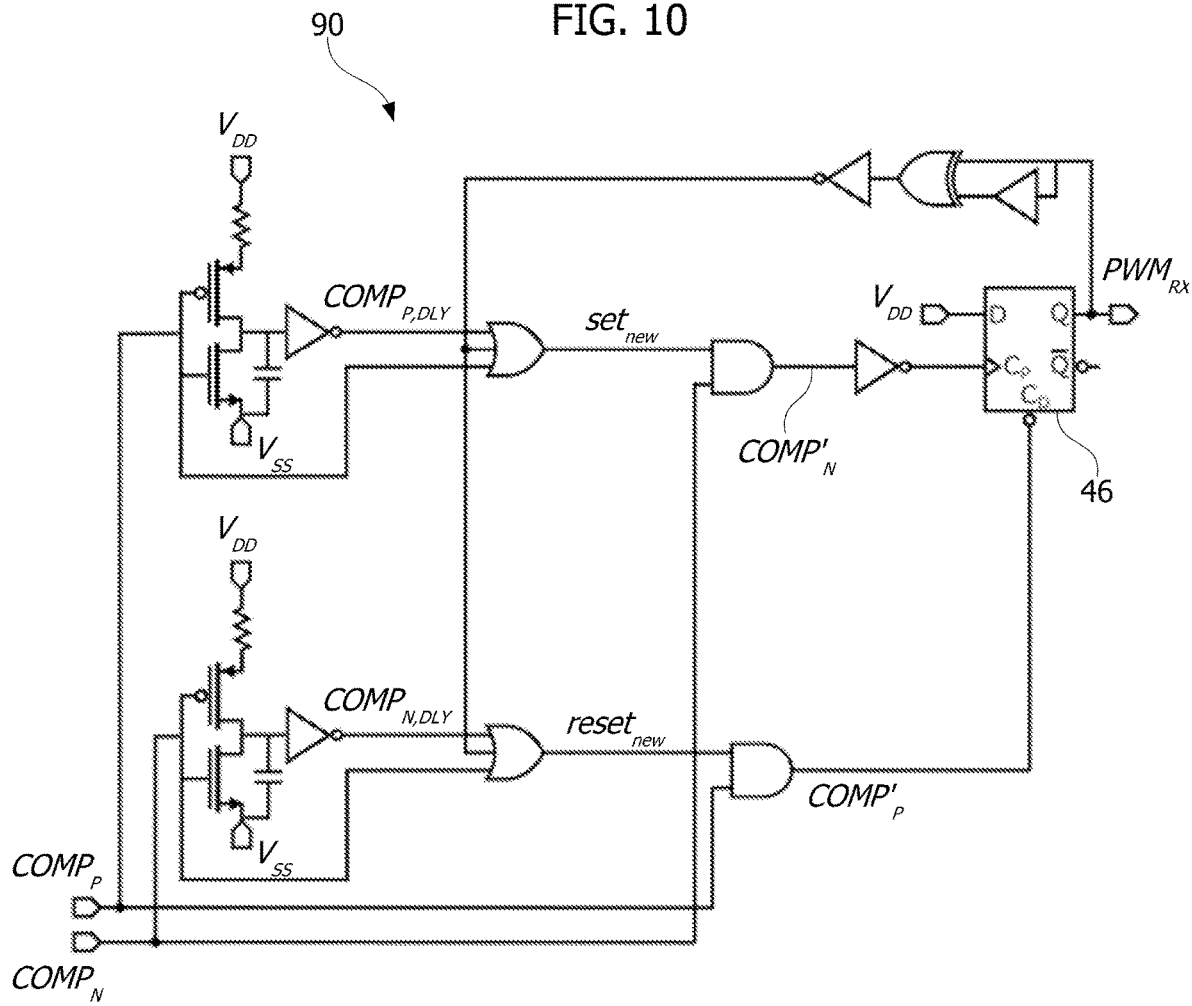
FIG. 10 is a circuit block diagram exemplary of a gate-level implementation of a portion of the receiver circuit of FIG. 9, according to one or more embodiments of the present description.
Figure 11:
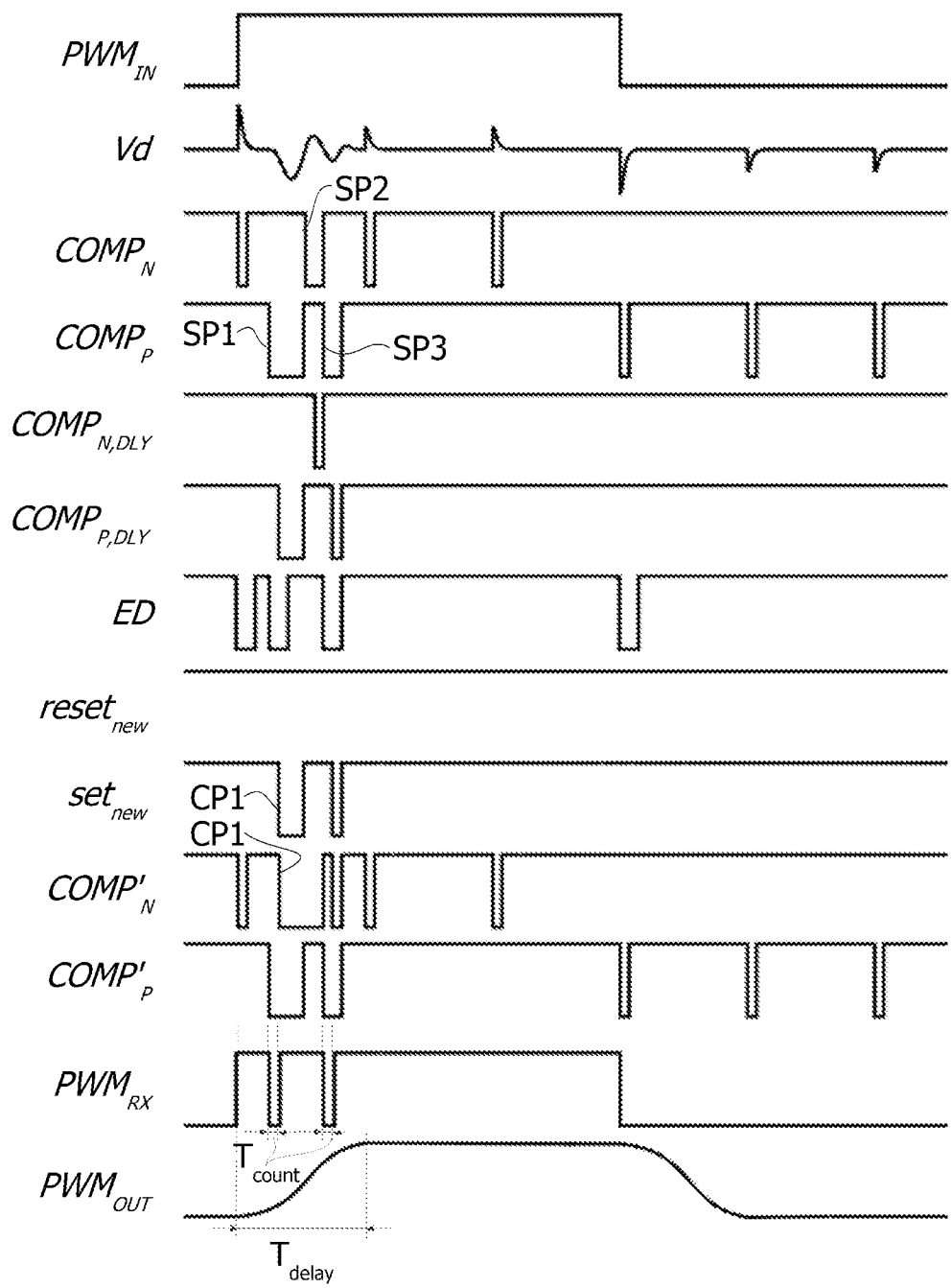
FIG. 11 is a time diagram including waveforms exemplary of signals in the receiver circuit of FIG. 9, according to one or more embodiments of the present description.

FIG. 10 is a circuit block diagram exemplary of a possible gate-level implementation of a logic circuit 90, and FIG. 11 is a time diagram including waveforms exemplary of signals in the receiver circuit 104', which illustrates possible operation of the receiver circuit.

The logic circuit 90 includes a first asymmetric buffer $91_P$ configured to receive the "original" reset signal $COMP_P$ and produce a first detection signal $COMP_{P,DLY}$. Signal $COMP_{P,DLY}$ substantially corresponds to a replica of signal $COMP_P$ where the active edges of the signal (e.g., the falling edges in the examples considered herein, where the reset signal $COMP_P$ is normally high) are delayed by an interval $T_{count}$ higher than the expected duration $T_r$ of the functional pulses FP. As a result, as exemplified in FIG. 11, signal $COMP_{P,DLY}$ is indicative of the spurious pulses SP of the reset signal $COMP_P$, insofar as the pulses having a duration higher than $T_{count}$ are propagated with a delayed active (e.g., falling) edge and an almost unaffected inactive (e.g., rising) edge, and the pulses having a duration lower than $T_{count}$ are not propagated from signal $COMP_P$ to signal $COMP_{P,DLY}$ (e.g., signal $COMP_{P,DLY}$ remains at a high logic level during those pulses). In particular, in one or more embodiments, the first asymmetric buffer $91_P$ may include a first inverter circuit including a pull-up transistor and a pull-down transistor arranged in series between a logic supply voltage $V_{DD}$ and a logic reference voltage $V_{SS}$, and driven by signal $COMP_P$. A capacitor is coupled in parallel to the conductive channel of the pull-down transistor (e.g., between the output node of the inverter circuit and the logic reference voltage $V_{SS}$) to delay the active (e.g., falling) edges. The inactive (e.g., rising) edges are kept fast to discharge the capacitors and make the buffer ready for the next detection action. A second inverter circuit is coupled to the output of the first inverter circuit, and thereby produces signal $COMP_{P,DLY}$ with the features discussed above.

Similarly, the logic circuit 90 includes a second asymmetric buffer $91_N$ configured to receive the "original" set signal $COMP_N$ and produce a second detection signal $COMP_{N,DLY}$. Signal $COMP_{N,DLY}$ substantially corresponds to a replica of signal $COMP_N$ where the active edges of the signal (e.g., the falling edges in the examples considered herein, where the set signal $COMP_N$ is normally high) are delayed by interval $T_{count}$. As a result, as exemplified in FIG. 11, signal $COMP_{N,DLY}$ is indicative of the spurious pulses SP of the set signal $COMP_N$, insofar as the pulses having a duration higher than $T_{count}$ are propagated with a delayed active (e.g., falling) edge and an almost unaffected inactive (e.g., rising) edge, and the pulses having a duration lower than $T_{count}$ are not propagated from signal $COMP_N$ to signal $COMP_{N,DLY}$ (e.g., signal $COMP_{N,DLY}$ remains at a high logic level during those pulses). In particular, in one or more embodiments, the second asymmetric buffer $91_N$ may include a first inverter circuit including a pull-up transistor and a pull-down transistor arranged in series between the logic supply voltage $V_{DD}$ and the logic reference voltage $V_{SS}$, and driven by signal $COMP_N$. A capacitor is coupled in parallel to the conductive channel of the pull-down transistor (e.g., between the output node of the inverter circuit and the logic reference voltage $V_{SS}$) to delay the active (e.g., falling) edges. The inactive (e.g., rising) edges are kept fast to discharge the capacitors and make the buffer ready for the next detection action. A second inverter circuit is coupled to the output of the first inverter circuit, and thereby produces signal $COMP_{N,DLY}$ with the features discussed above.

Further, the logic circuit 90 includes an edge detector circuit 92 coupled to the output of flip-flop 46 and configured to produce an edge detection signal ED that is indicative of the transitions (e.g., edges) of the reconstructed PWM signal $PWM_{RX}$, as exemplified in FIG. 11. In particular, the edge detection signal ED may be normally high and may include a low pulse at each occurrence of a transition (e.g., edge) of signal $PWM_{RX}$. The duration $T_{ED}$ of such low pulse may be longer than $T_{count}$. In particular, in one or more embodiments, the edge detector circuit 92 may include a delay circuit block configured to produce a replica of signal $PWM_{RX}$ delayed by an interval $T_{ED}$, an XOR logic gate configured to apply XOR logic processing to signal $PWM_{RX}$ and its delayed replica, and an inverter circuit coupled to the output of the XOR logic gate to produce the edge detection signal ED with the features discussed above.

Further, the logic circuit 90 includes a first gating logic gate $93_P$ configured to combine the first detection signal $COMP_{P,DLY}$ and the edge detection signal ED to discard the spurious pulses of signal $COMP_{P,DLY}$ that do not correspond to a transition of the reconstructed PWM signal $PWM_{RX}$, thereby producing a set correction signal $set_{new}$ that is indicative of a corrective action having to be implemented in the original set signal $COMP_N$ to produce the corrected set signal $COMP'_N$. In particular, the set correction signal $set_{new}$ may be normally high and may include a low pulse when both signals $COMP_{P,DLY}$ and ED have a low pulse. Therefore, in one or more embodiments the first gating logic gate may include an OR gate $93_P$ configured to apply OR logic processing to signals $COMP_{P,DLY}$ and ED to produce signal $set_{new}$.

Similarly, the logic circuit 90 includes a second gating logic gate $93_N$ configured to combine the second detection signal $COMP_{N,DLY}$ and the edge detection signal ED to discard the spurious pulses of signal $COMP_{N,DLY}$ that do not correspond to a transition of the reconstructed PWM signal $PWM_{RX}$, thereby producing a reset correction signal $reset_{new}$ that is indicative of a corrective action having to be implemented in the original reset signal $COMP_P$ to produce the corrected reset signal $COMP'_P$. In particular, the reset correction signal $reset_{new}$ may be normally high and may include a low pulse when both signals $COMP_{N,DLY}$ and ED have a low pulse. Therefore, in one or more embodiments the second gating logic gate may include an OR gate $93_N$ configured to apply OR logic processing to signals $COMP_{N,DLY}$ and ED to produce signal $reset_{new}$.

Further, the logic circuit 90 includes a first corrective logic gate $94_P$ configured to combine the set correction signal set new and the original set signal $COMP_N$ to add to signal $COMP_N$ the corrective pulses that are intended to restore the correct value of signal $PWM_{RX}$ following a spurious reset pulse, thereby producing the corrected set signal $COMP'_N$. In particular, the corrected set signal $COMP'_N$ may be normally high and may include low pulses corresponding to the pulses of signals $COMP_N$ and $set_{new}$. Therefore, in one or more embodiments the first corrective logic gate $94_P$ may include an AND gate $94_P$ configured to apply AND logic processing to signals $COMP_N$ and $set_{new}$ to produce signal $COMP'_N$.

Similarly, the logic circuit 90 includes a second corrective logic gate $94_N$ configured to combine the reset correction signal $reset_{new}$ and the original reset signal $COMP_P$ to add to signal $COMP_P$ the corrective pulses that are intended to restore the correct value of signal $PWM_{RX}$ following a spurious set pulse, thereby producing the corrected reset signal $COMP'_P$. In particular, the corrected reset signal $COMP'_P$ may be normally high and may include low pulses corresponding to the pulses of signals $COMP_P$ and $reset_{new}$. Therefore, in one or more embodiments the second corrective logic gate $94_N$ may include an AND gate $94_N$ configured to apply AND logic processing to signals $COMP_P$ and $reset_{new}$ to produce signal $COMP'_P$.

Figure 1:
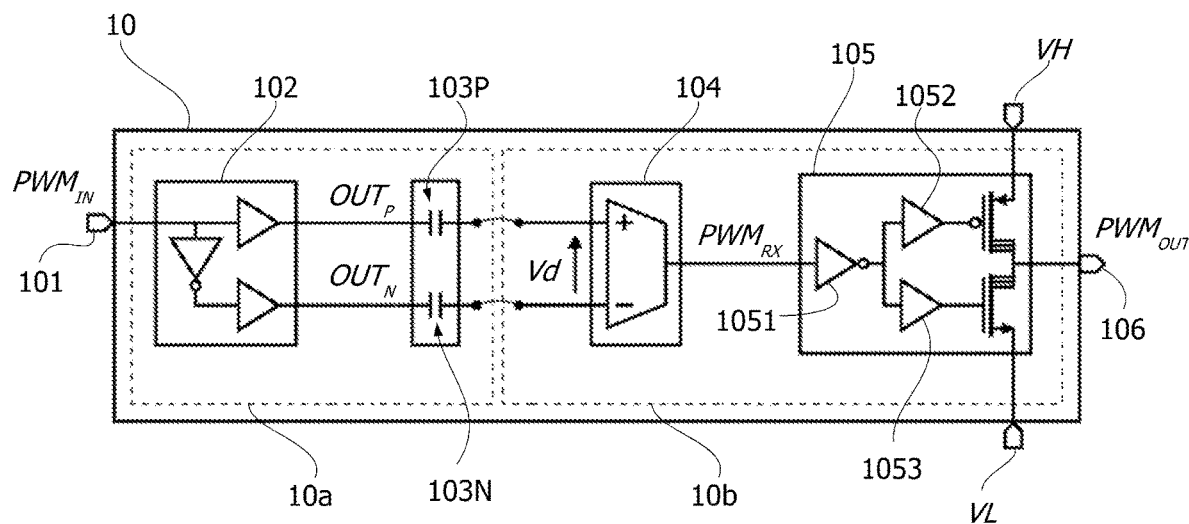
FIGS. 1 to 7 have already been described in the foregoing.
Figure 2:
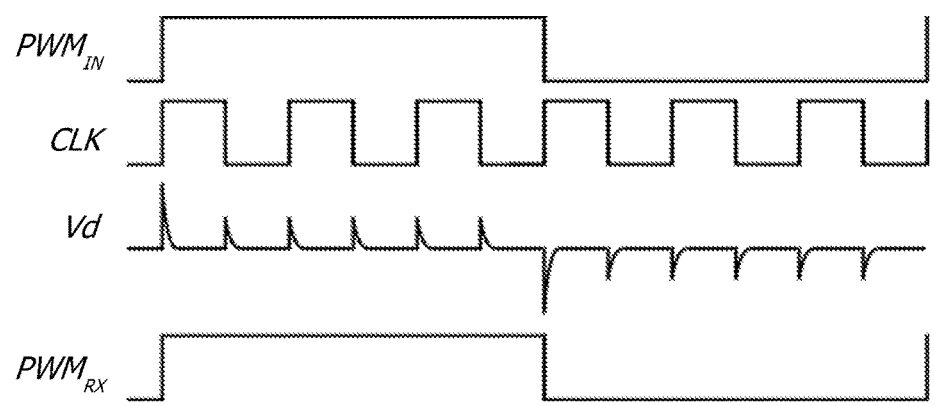
Figure 3:
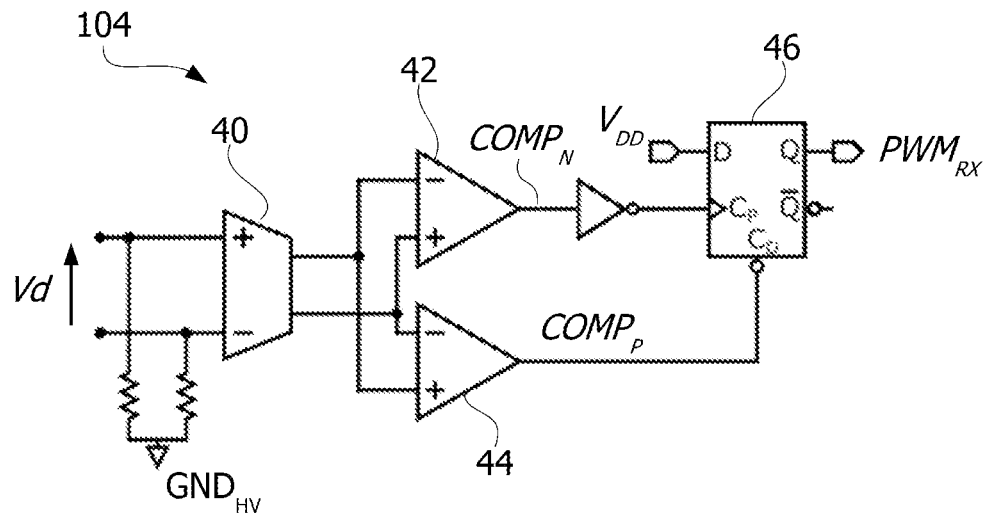
Figure 4:
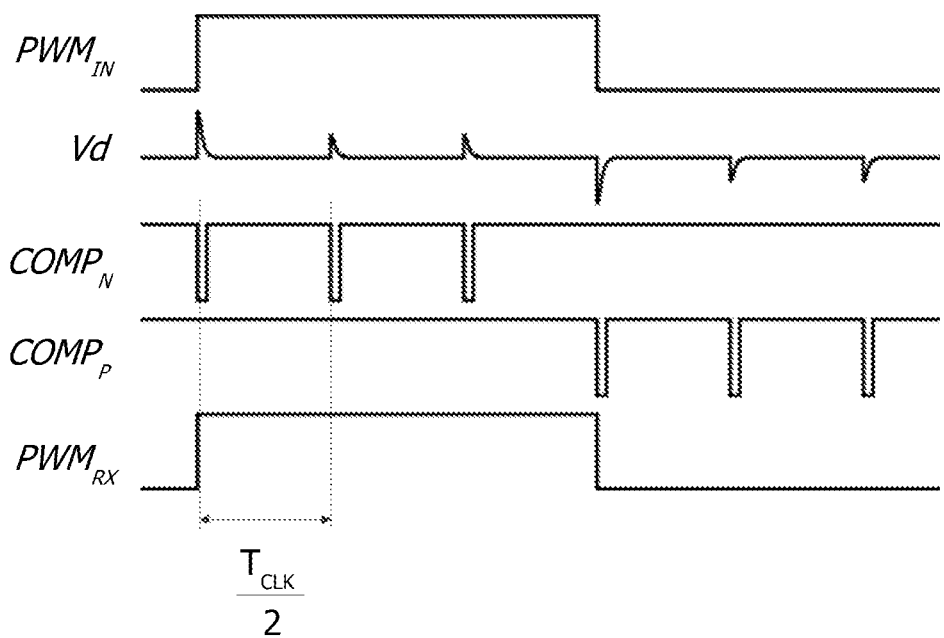
Figure 5:
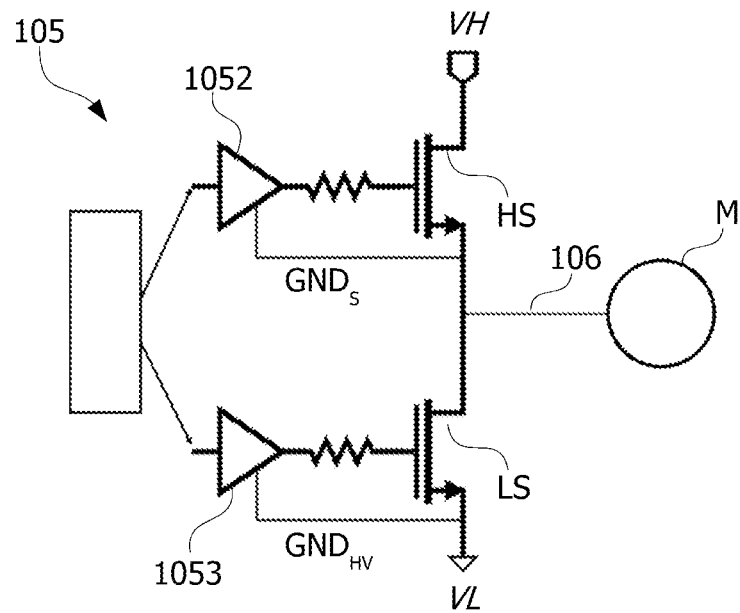
Figure 6:
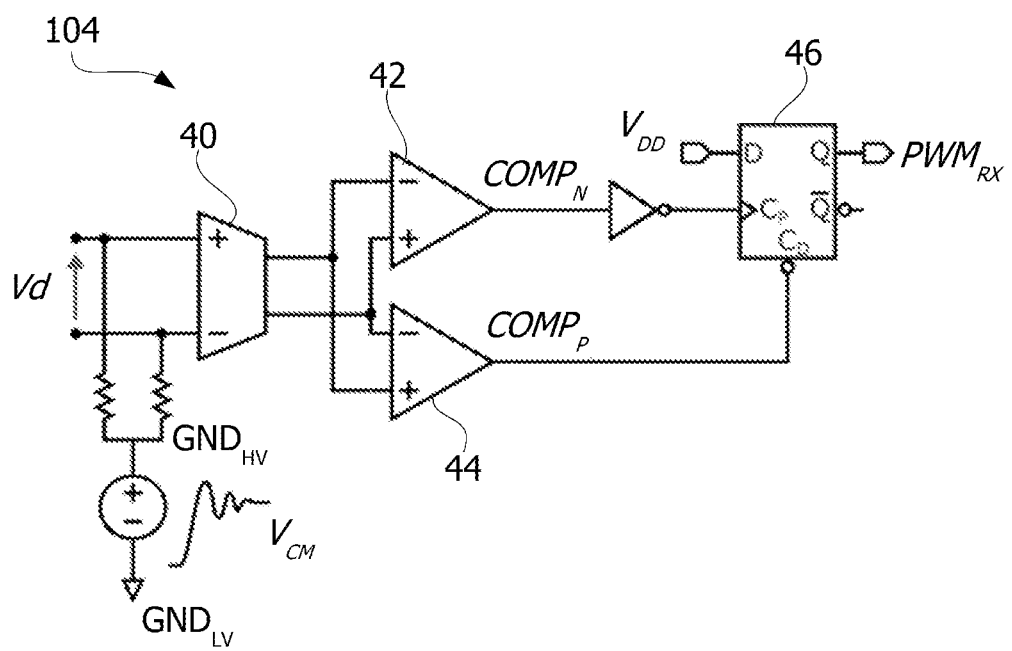

As exemplified in FIG. 10, the corrected signals $COMP'_N$ and $COMP'_P$ are then used as the set and reset signals of the set-reset (S-R) flip-flop 46 of receiver 104', as described with reference to FIG. 3. Thus, flip-flop 46 receives signal $COMP'_N$ (possibly complemented by an inverter stage) at its clock input terminal $C_P$ and signal $COMP'_P$ at its reset input terminal $C_D$ to produce the reconstructed PWM signal $PWM_{RX}$.

Optionally, the first gating logic gate $93_P$ may be further configured to receive signal $COMP_P$ and combine it with signals $COMP_{P,DLY}$ and ED so that the inactive (e.g., rising) edges of signal $COMP_P$ are quickly propagated to the set correction signal $set_{new}$. Indeed, it has been previously discussed that the asymmetric buffer $91_P$ is configured to delay substantially (e.g., by an interval $T_{count}$) the active (e.g., falling) edges of signal $COMP_P$ while passing without substantial delay the inactive (e.g., rising) edges. However, if signal $COMP_P$ are not directly propagated to gate $93_P$, the inactive edges are propagated via the two cascaded inverter circuits of the asymmetric buffer $91_P$. By directly propagating signal $COMP_P$ to gate $93_P$, instead, the propagation delay of the asymmetric buffer $91_P$ can be avoided for the inactive edges. Therefore, in one or more embodiments the first gating logic gate may include an OR gate $93_P$ configured to apply OR logic processing to signals $COMP_{P,DLY}$, $COMP_P$ and ED to produce signal $set_{new}$. Similarly, the second gating logic gate $93_N$ may be optionally further configured to receive signal $COMP_N$ and combine it with signals $COMP_{N,DLY}$ and ED so that the inactive (e.g., rising) edges of signal $COMP_N$ are quickly propagated to the reset correction signal $reset_{new}$. Therefore, in one or more embodiments the second gating logic gate may include an OR gate $93_N$ configured to apply OR logic processing to signals $COMP_{N,DLY}$, $COMP_N$ and ED to produce signal $reset_{new}$.

FIG. 11 is a time diagram including waveforms exemplary of signals in the receiver circuit 104' of FIG. 10, which illustrates possible operation of the receiver circuit. Here it is shown, by way of example, that a spurious pulse SP1 of signal $COMP_P$ forces the reconstructed signal $PWM_{RX}$ to a low logic value (while signal $PWM_{RX}$ is expected to stay at a high logic value, copying signal $PWM_{IN}$). The spurious pulse SP1 is detected, due to its duration being longer than $T_{count}$, by signal $COMP_{P,DLY}$ which switches to a low logic value. In the meanwhile, also the edge detection signal ED switches to a low logic value since signal $PWM_{RX}$ has switched due to the spurious pulse. Since signal $COMP_{P,DLY}$ indicates the presence of a spurious reset pulse and signal ED indicates that signal $PWM_{RX}$ has changed its state, a corrective set pulse CP1 is generated in signal $set_{new}$ and propagated to the corrected set signal $COMP_N$, so that the flip-flop 46 is set again and signal $PWM_{RX}$ switches again to its previous (correct) state. Signal $PWM_{RX}$ maintains the wrong value just for an interval $T_{count}$ that is quite lower than the propagation delay $T_{delay}$ of the pre-driver circuit 105, so that the output $PWM_{OUT}$ of the pre-driver circuit has no time to switch and is not affected. Furthermore, thanks to the gating action of signal ED, no corrective reset pulses are generated even when a spurious pulse SP2 of signal $COMP_N$ is detected (see signal $reset_{new}$ that maintains a high logic value even during SP2), since in this case signal $PWM_{RX}$ already has the correct value and the spurious pulse SP2 does not corrupt it.

One or more embodiments may thus prove advantageous insofar as they provide a receiver circuit having an advanced grade of robustness against common-mode noises by using (only) logic circuitry added in the decoding circuit to correct spurious signals generated by ringing. Thus, one or more embodiments rely on a simple implementation (e.g., just including additional logic gates compared to the conventional solutions), which is compatible with the conventional transmitter/receiver architectures.

Without prejudice to the underlying principles, the details and embodiments may vary, even significantly, with respect to what has been described by way of example only, without departing from the extent of protection.

The extent of protection is determined by the annexed claims.

A receiver circuit (104'), may be summarized as including: a pair of input nodes configured to receive a differential signal (Vd) therebetween, the differential signal (Vd) including spikes of a first polarity and spikes of a second polarity; an output node configured to produce a digital output signal ($PWM_{RX}$) as a function of said differential signal (Vd); a first comparator circuit (42) configured to receive said differential signal (Vd) and to produce an intermediate set signal ($COMP_N$) that includes a pulse at each spike of said differential signal (Vd) having said first polarity; a second comparator circuit (44) configured to receive said differential signal (Vd) and to produce an intermediate reset signal ($COMP_P$) that includes a pulse at each spike of said differential signal (Vd) having said second polarity; a logic circuit (90) configured to receive said intermediate set signal ($COMP_N$), said intermediate reset signal ($COMP_P$) and said digital output signal ($PWM_{RX}$), and further configured to: detect (92, ED) whether said digital output signal ($PWM_{RX}$) switches between a first logic value and a second logic value; detect ($91_P$, $COMP_{P,DLY}$) whether said intermediate reset signal ($COMP_P$) includes a pulse (SP1, SP3) having a duration higher than a certain time interval ($T_{count}$); produce ($93_P$) a set correction signal ($set_{new}$) that includes a pulse when said digital output signal ($PWM_{RX}$) switches between a first logic value and a second logic value and, at the same time, said intermediate reset signal ($COMP_P$) includes a pulse (SP1, SP3) having a duration higher than said certain time interval ($T_{count}$); produce ($94_P$) a corrected set signal ($COMP'_N$) that includes the pulses of said intermediate set signal ($COMP_N$) and the pulses of said set correction signal ($set_{new}$); detect ($91_N$, $COMP_{N,DLY}$) whether said intermediate set signal ($COMP_N$) includes a pulse (SP2) having a duration higher than said certain time interval ($T_{count}$); produce ($93_N$) a reset correction signal ($reset_{new}$) that includes a pulse when said digital output signal ($PWM_{RX}$) switches between a first logic value and a second logic value and, at the same time, said intermediate set signal ($COMP_N$) includes a pulse (SP2) having a duration higher than said certain time interval ($T_{count}$); and produce ($94_N$) a corrected reset signal ($COMP'_P$) that includes the pulses of said intermediate reset signal ($COMP_P$) and the pulses of said reset correction signal ($reset_{new}$); and an output control circuit (46) configured to receive said corrected set signal ($COMP'_N$) and said corrected reset signal ($COMP'_P$), and further configured to assert said digital output signal ($PWM_{RX}$) in response to a pulse being detected in said corrected set signal ($COMP'_N$) and de-assert said digital output signal ($PWM_{RX}$) in response to a pulse being detected in said corrected reset signal ($COMP'_P$).

Said logic circuit (90) may include: a first asymmetric buffer circuit ($91_P$) configured to receive said intermediate reset signal ($COMP_P$) and produce a first detection signal ($COMP_{P,DLY}$) by passing the active edges of said intermediate reset signal ($COMP_P$) with a delay equal to said certain time interval ($T_{count}$) and passing the inactive edges of said intermediate reset signal ($COMP_P$) without substantial delay; a first gating logic gate ($93_P$) configured to pass said first detection signal ($COMP_{P,DLY}$) when said digital output signal ($PWM_{RX}$) switches between a first logic value and a second logic value, and mask said first detection signal ($COMP_{P,DLY}$) otherwise, to produce said set correction signal ($set_{new}$); a second asymmetric buffer circuit ($91_N$) configured to receive said intermediate set signal ($COMP_N$) and produce a second detection signal ($COMP_{N,DLY}$) by passing the active edges of said intermediate set signal ($COMP_N$) with a delay equal to said certain time interval ($T_{count}$) and passing the inactive edges of said intermediate set signal ($COMP_N$) without substantial delay; and a second gating logic gate ($93_N$) configured to pass said second detection signal ($COMP_{N,DLY}$) when said digital output signal ($PWM_{RX}$) switches between a first logic value and a second logic value, and mask said second detection signal ($COMP_{N,DLY}$) otherwise, to produce said reset correction signal ($reset_{new}$).

Said first asymmetric buffer circuit ($91_P$) may include: a first inverter circuit including a first pull-up transistor and a first pull-down transistor alternately driven by said intermediate reset signal ($COMP_P$); a first capacitor coupled in parallel to said first pull-down transistor; and a second inverter circuit coupled to said first inverter circuit to produce said first detection signal ($COMP_{P,DLY}$); and wherein said second asymmetric buffer circuit ($91_N$) may include: a third inverter circuit including a second pull-up transistor and a second pull-down transistor alternately driven by said intermediate set signal ($COMP_N$); a second capacitor coupled in parallel to said second pull-down transistor; and a fourth inverter circuit coupled to said third inverter circuit to produce said second detection signal ($COMP_{N,DLY}$).

Said logic circuit (90) may include: a first corrective logic gate ($94_P$) configured to pass the pulses of said intermediate set signal ($COMP_N$) and the pulses of said set correction signal ($set_{new}$) to produce said corrected set signal ($COMP'_N$); and a second corrective logic gate ($94_N$) configured to pass the pulses of said intermediate reset signal ($COMP_P$) and the pulses of said reset correction signal ($reset_{new}$) to produce said corrected reset signal ($COMP'_P$).

Said logic circuit (90) may include an edge detector circuit (92) configured to receive said digital output signal ($PWM_{RX}$) and to produce an edge detection signal (ED) that includes a pulse at each commutation of said digital output signal ($PWM_{RX}$) between a first logic value and a second logic value, wherein the edge detector circuit (92) may include: a delay circuit block configured to receive said digital output signal ($PWM_{RX}$) and propagate said digital output signal ($PWM_{RX}$) with a respective delay ($T_{ED}$) to produce a delayed digital output signal; and an exclusive-OR gate configured to combine the digital output signal ($PWM_{RX}$) and the delayed digital output signal to produce said edge detection signal (ED), wherein said respective delay ($T_{ED}$) may be higher than said certain time interval ($T_{count}$).

Said intermediate reset signal ($COMP_P$) and said first detection signal ($COMP_{P,DLY}$) may be normally high, the active edges of said intermediate reset signal ($COMP_P$) may be falling edges, and the inactive edges of said intermediate reset signal ($COMP_P$) may be rising edges; said intermediate set signal ($COMP_N$) and said second detection signal ($COMP_{N,DLY}$) may be normally high, the active edges of said intermediate set signal ($COMP_N$) may be falling edges, and the inactive edges of said intermediate set signal ($COMP_N$) may be rising edges; said edge detection signal (ED) may be normally high and includes low pulses pulse at each commutation of said digital output signal ($PWM_{RX}$) between a first logic value and a second logic value; said first gating logic gate ($93_P$) may include an OR gate configured to apply OR logic processing to said first detection signal ($COMP_{P,DLY}$) and said edge detection signal (ED) to produce said set correction signal ($set_{new}$); said second gating logic gate ($93_N$) may include an OR gate configured to apply OR logic processing to said second detection signal ($COMP_{N,DLY}$) and said edge detection signal (ED) to produce said reset correction signal ($reset_{new}$); said first corrective logic gate ($94_P$) may include an AND gate configured to apply AND logic processing to said set correction signal ($set_{new}$) and said intermediate set signal ($COMP_N$) to produce said corrected set signal ($COMP'_N$); and said second corrective logic gate ($94_N$) may include an AND gate configured to apply AND logic processing to said reset correction signal ($reset_{new}$) and said intermediate reset signal ($COMP_P$) to produce said corrected reset signal ($COMP'_P$).

Said first gating logic gate ($93_P$) may be further configured to apply OR logic processing to said intermediate reset signal ($COMP_P$) to produce said set correction signal ($set_{new}$), and said second gating logic gate ($93_N$) may be further configured to apply OR logic processing to said intermediate set signal ($COMP_N$) to produce said reset correction signal ($reset_{new}$).

Said output control circuit may include a set-reset flip-flop (46), the set-reset flip-flop (46) having a clock input terminal ($C_P$) driven by said corrected set signal ($COMP'_N$) and a reset input terminal ($C_D$) driven by said corrected reset signal (COMP'$_P$) to produce said digital output signal (PWM$_{RX}$) at a data output terminal (Q) of the set-reset flip-flop (46).

The receiver circuit (104') may include an amplifier circuit (40) configured to receive said differential signal (Vd) and pass an amplified replica of said differential signal (Vd) to said first comparator circuit (42) and to said second comparator circuit (44).

The receiver circuit (104') may include a driver circuit that includes a half-bridge circuit, the half-bridge circuit being arranged between a positive supply voltage pin (VH) and a reference supply voltage pin (VL) and driven by said digital output signal (PWM$_{RX}$) to produce an output switching signal (PWM$_{OUT}$).

An isolated driver device (10), may be summarized as including a first semiconductor die (10a) and a second semiconductor die (10b), wherein the first semiconductor die (10a) including: an input pin (101) configured to receive a digital input signal (PWM$_{IN}$); a transmitter circuit (102) configured to receive said digital input signal (PWM$_{IN}$) and to produce a pair of complementary digital signals (OUT$_P$, OUT$_N$), wherein a first one (OUT$_P$) of said complementary digital signals is a replica of said digital input signal (PWM$_{IN}$) and is produced at a first output node of said transmitter circuit (102), and a second one (OUT$_N$) of said complementary digital signals is the complement of said digital input signal (PWM$_{IN}$) and is produced at a second output node of said transmitter circuit (102); and a galvanic isolation barrier including a first isolation capacitor (103P) having a first terminal coupled to the first output node of said transmitter circuit (102) and a second isolation capacitor (103N) having a first terminal coupled to the second output node of said transmitter circuit (102), whereby a differential signal (Vd) is produced between a second terminal of said first isolation capacitor (103P) and a second terminal of said second isolation capacitor (103N), the differential signal (Vd) including a spike of a first polarity at each rising edge of said digital input signal (PWM$_{IN}$) and a spike of a second polarity at each falling edge of said digital input signal (PWM$_{IN}$); wherein the second semiconductor die (10b) includes a receiver circuit (104') according to any of the previous claims; and wherein a first input node of the receiver circuit (104') is electrically coupled to the second terminal of said first isolation capacitor (103P) and a second input node of the receiver circuit (104') is electrically coupled to the second terminal of said second isolation capacitor (103P) to receive said differential signal (Vd).

An electronic system may be summarized as including a processing unit and an isolated driver device (10), the processing unit being configured to generate said digital input signal (PWM$_{IN}$) received by the isolated driver device (10).

A method of decoding a differential signal (Vd) into a digital output signal (PWM$_{RX}$), the method may be summarized as including: receiving a differential signal (Vd) that includes spikes of a first polarity and spikes of a second polarity; producing an intermediate set signal (COMP$_N$) that includes a pulse at each spike of said differential signal (Vd) having said first polarity; producing an intermediate reset signal (COMP$_P$) that includes a pulse at each spike of said differential signal (Vd) having said second polarity; detecting (92, ED) whether said digital output signal (PWM$_{RX}$) switches between a first logic value and a second logic value; detecting (91$_P$, COMP$_{P,DLY}$) whether said intermediate reset signal (COMP$_P$) includes a pulse (SP1, SP3) having a duration higher than a certain time interval (T$_{count}$); producing (93$_P$) a set correction signal (set$_{new}$) that includes a pulse when said digital output signal (PWM$_{RX}$) switches between a first logic value and a second logic value and, at the same time, said intermediate reset signal (COMP$_P$) includes a pulse (SP1, SP3) having a duration higher than said certain time interval (T$_{count}$); producing (94$_P$) a corrected set signal (COMP'$_N$) that includes the pulses of said intermediate set signal (COMP$_N$) and the pulses of said set correction signal (set$_{new}$); detecting (91$_N$, COMP$_{N,DLY}$) whether said intermediate set signal (COMP$_N$) includes a pulse (SP2) having a duration higher than said certain time interval (T$_{count}$); producing (93$_N$) a reset correction signal (reset$_{new}$) that includes a pulse when said digital output signal (PWM$_{RX}$) switches between a first logic value and a second logic value and, at the same time, said intermediate set signal (COMP$_N$) includes a pulse (SP2) having a duration higher than said certain time interval (T$_{count}$); producing (94$_N$) a corrected reset signal (COMP'$_P$) that includes the pulses of said intermediate reset signal (COMP$_P$) and the pulses of said reset correction signal (reset$_{new}$); and asserting said digital output signal (PWM$_{RX}$) in response to a pulse being detected in said corrected set signal (COMP'$_N$) and de-asserting said digital output signal (PWM$_{RX}$) in response to a pulse being detected in said corrected reset signal (COMP'$_P$).

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising a receiver circuit, the receiver circuit including:
    a pair of input nodes configured to receive a differential signal therebetween, the differential signal including spikes of a first polarity and spikes of a second polarity;
    an output node configured to produce a digital output signal as a function of the differential signal;
    a first comparator circuit configured to receive the differential signal and to produce an intermediate set signal that includes a pulse at each spike of the differential signal having the first polarity;
    a second comparator circuit configured to receive the differential signal and to produce an intermediate reset signal that includes a pulse at each spike of the differential signal having the second polarity;
    a logic circuit configured to receive the intermediate set signal, the intermediate reset signal and the digital output signal, and to generate a corrected set signal and a corrected reset signal; and
    an output control circuit configured to receive the corrected set signal and the corrected reset signal, and further configured to assert the digital output signal based on the corrected set signal and the corrected reset signal.

2. The device circuit of claim 1, wherein the output control circuit is configured to assert the digital output signal in response to a pulse being detected in the corrected set signal and de-assert the digital output signal in response to a pulse being detected in the corrected reset signal.

3. The device of claim 2, wherein the logic circuit is configured to:
    detect whether the digital output signal switches between a first logic value and a second logic value;

detect whether the intermediate reset signal includes a pulse having a duration higher than a certain time interval;

produce a set correction signal that includes a pulse when the digital output signal switches between a first logic value and a second logic value and, at the same time, the intermediate reset signal includes a pulse having a duration higher than the certain time interval;

produce a corrected set signal that includes the pulses of the intermediate set signal and the pulses of the set correction signal;

detect whether the intermediate set signal includes a pulse having a duration higher than the certain time interval;

produce a reset correction signal that includes a pulse when the digital output signal switches between a first logic value and a second logic value and, at the same time, the intermediate set signal includes a pulse having a duration higher than the certain time interval; and produce a corrected reset signal that includes the pulses of the intermediate reset signal and the pulses of the reset correction signal.

4. The device of claim 3, wherein the logic circuit includes:

a first asymmetric buffer circuit configured to receive the intermediate reset signal and produce a first detection signal by passing active edges of the intermediate reset signal with a delay equal to the certain time interval and passing inactive edges of the intermediate reset signal without substantial delay;

a first gating logic gate configured to pass the first detection signal when the digital output signal switches between a first logic value and a second logic value, and mask the first detection signal otherwise, to produce the set correction signal;

a second asymmetric buffer circuit configured to receive the intermediate set signal and produce a second detection signal by passing the active edges of the intermediate set signal with a delay equal to the certain time interval and passing the inactive edges of the intermediate set signal without substantial delay; and a second gating logic gate configured to pass the second detection signal when the digital output signal switches between a first logic value and a second logic value, and mask the second detection signal otherwise, to produce the reset correction signal.

5. The device of claim 4, wherein the first asymmetric buffer circuit includes:

a first inverter circuit including a first pull-up transistor and a first pull-down transistor alternately driven by the intermediate reset signal;

a first capacitor coupled in parallel to the first pull-down transistor; and a second inverter circuit coupled to the first inverter circuit to produce the first detection signal;

and wherein the second asymmetric buffer circuit includes:

a third inverter circuit including a second pull-up transistor and a second pull-down transistor alternately driven by the intermediate set signal;

a second capacitor coupled in parallel to the second pull-down transistor; and a fourth inverter circuit coupled to the third inverter circuit to produce the second detection signal.

6. The device of claim 4, wherein the logic circuit includes:

a first corrective logic gate configured to pass the pulses of the intermediate set signal and the pulses of the set correction signal to produce the corrected set signal; and a second corrective logic gate configured to pass the pulses of the intermediate reset signal and the pulses of the reset correction signal to produce the corrected reset signal.

7. The device of claim 6, wherein the logic circuit includes an edge detector circuit configured to receive the digital output signal and to produce an edge detection signal that includes a pulse at each commutation of the digital output signal between a first logic value and a second logic value, wherein the edge detector circuit includes:

a delay circuit block configured to receive the digital output signal and propagate the digital output signal with a respective delay to produce a delayed digital output signal; and an exclusive-OR gate configured to combine the digital output signal and the delayed digital output signal to produce the edge detection signal, wherein the respective delay is higher than the certain time interval.

8. The device of claim 7, wherein:

said intermediate reset signal and the first detection signal are normally high, the active edges of the intermediate reset signal are falling edges, and the inactive edges of the intermediate reset signal are rising edges;

said intermediate set signal and the second detection signal are normally high, the active edges of the intermediate set signal are falling edges, and the inactive edges of the intermediate set signal are rising edges;

said edge detection signal is normally high and includes a low pulse at each commutation of the digital output signal between a first logic value and a second logic value;

said first gating logic gate includes an OR gate configured to apply OR logic processing to the first detection signal and the edge detection signal to produce the set correction signal;

said second gating logic gate includes an OR gate configured to apply OR logic processing to the second detection signal and the edge detection signal to produce the reset correction signal;

said first corrective logic gate includes an AND gate configured to apply AND logic processing to the set correction signal and the intermediate set signal to produce the corrected set signal; and said second corrective logic gate includes an AND gate configured to apply AND logic processing to the reset correction signal and the intermediate reset signal to produce the corrected reset signal.

9. The device of claim 8, wherein the first gating logic gate is further configured to apply OR logic processing to the intermediate reset signal to produce the set correction signal, and the second gating logic gate is further configured to apply OR logic processing to the intermediate set signal to produce the reset correction signal.

10. The device of claim 3, wherein the output control circuit includes a set-reset flip-flop, the set-reset flip-flop having a clock input terminal driven by the corrected set signal and a reset input terminal driven by the corrected reset signal to produce the digital output signal at a data output terminal of the set-reset flip-flop.

11. The device of claim 3, comprising an amplifier circuit configured to receive the differential signal and pass an amplified replica of the differential signal to the first comparator circuit and to the second comparator circuit.

12. The device of claim 3, comprising a driver circuit that includes a half-bridge circuit, the half-bridge circuit being arranged between a positive supply voltage pin and a reference supply voltage pin and driven by the digital output signal to produce an output switching signal.

13. The device of claim 1, comprising an isolated driver device including:
a first semiconductor die including:
an input pin configured to receive a digital input signal;
a transmitter circuit configured to receive the digital input signal and to produce:
a first complementary digital signal that is a replica of the digital input signal at a first output node; and
a second complementary digital signal that is a complement of the digital input signal at a second output node;
a galvanic isolation barrier including a first isolation capacitor having a first terminal coupled to the first output node of the transmitter circuit and a second isolation capacitor having a first terminal coupled to the second output node of the transmitter circuit, whereby a differential signal is produced between a second terminal of the first isolation capacitor and a second terminal of the second isolation capacitor, the differential signal including a spike of a first polarity at each rising edge of the digital input signal and a spike of a second polarity at each falling edge of the digital input signal; and
a second semiconductor die including the receiver circuit, wherein a first input node of the receiver circuit is electrically coupled to the second terminal of the first isolation capacitor and a second input node of the receiver circuit is electrically coupled to the second terminal of the second isolation capacitor to receive the differential signal.

14. The device of claim 13, comprising a processing unit configured to generate the digital input signal received by the isolated driver device.

15. A receiver circuit, comprising:
a differential input including a first input node and a second input node;
a first comparator circuit having an inverting input coupled to the first input node and a non-inverting input coupled to the second input node;
a second comparator circuit having an inverting input coupled to the second input node and a non-inverting input coupled to the first input node;
a logic circuit having a first input coupled to an output of the first comparator circuit a second input coupled to an output of the second comparator circuit; and
an output control circuit having a first input coupled to a first output of the logic circuit, a second input coupled to a second output of the logic circuit, and an output terminal, wherein the logic circuit includes a third input coupled to the output of the output control circuit.

16. The receiver circuit of claim 15, wherein the logic circuit includes:
a first inverter;
a second inverter;
a first OR gate including a first input coupled to the first input of the logic circuit, a second input coupled to the third input of the logic circuit, and a third input coupled to an output of the first inverter; and
a second OR gate including a first input coupled to the second input of the logic circuit, a second input coupled to the third input of the logic circuit, and a third input coupled to an output of the second inverter.

17. The receiver circuit of claim 16, wherein the logic circuit includes:
a first AND gate have a first input coupled to an output of the first OR gate, a second input coupled to the second input of the logic circuit, and an output corresponding to the first output of the logic circuit; and
a second AND gate have a first input coupled to an output of the second OR gate, a second input coupled to the first input of the logic circuit, and an output corresponding to the second output of the logic circuit.

18. A device, comprising:
an amplifier configured to receive a differential input signal and to output an amplified differential signal;
a first comparator coupled to the amplifier and configured to receive the differential signal and to output an intermediate set signal;
a second comparator coupled to the amplifier circuit and configured to receive the differential signal and to output an intermediate reset signal;
an output node configured to produce a digital output signal as a function of the differential signal;
a logic circuit coupled to the first comparator and the second comparator and configured to receive the intermediate set signal, the intermediate reset signal and to generate a corrected set signal and a corrected reset signal; and
an output control circuit coupled to the logic circuit and configured to receive the corrected set signal and the corrected reset signal and further configured to assert a digital output signal based on the corrected set signal and the corrected reset signal, wherein the logic circuit is coupled to receive the digital output signal.

19. The device of claim 18, further comprising an inverter coupled between the logic circuit and the output control circuit.

20. The device of claim 18, wherein the output control circuit is configured to assert the digital output signal in response to a pulse being detected in the corrected set signal and de-assert the digital output signal in response to a pulse being detected in the corrected reset signal.

* * * * *